(12) United States Patent
Kravitz et al.

(10) Patent No.: US 10,951,219 B2
(45) Date of Patent: Mar. 16, 2021

(54) METHOD FOR GENERATING A SYNTHETIC TIME PERIOD OUTPUT SIGNAL

(71) Applicant: Micro Motion, Inc., Boulder, CO (US)

(72) Inventors: Andrew S. Kravitz, Frederick, CO (US); Craig B. McAnally, Thornton, CO (US)

(73) Assignee: Micro Motion, Inc., Boulder, CO (US)

( * ) Notice: Subject to any disclaimer, the term of this patent is extended or adjusted under 35 U.S.C. 154(b) by 249 days.

(21) Appl. No.: 15/748,573

(22) PCT Filed: Nov. 30, 2015

(86) PCT No.: PCT/US2015/062972
§ 371 (c)(1),
(2) Date: Jan. 29, 2018

(87) PCT Pub. No.: WO2017/039732
PCT Pub. Date: Mar. 9, 2017

(65) Prior Publication Data
US 2018/0219556 A1   Aug. 2, 2018

Related U.S. Application Data

(60) Provisional application No. 62/211,417, filed on Aug. 28, 2015.

(51) Int. Cl.
*G01N 11/16*     (2006.01)
*H03M 1/06*      (2006.01)
(Continued)

(52) U.S. Cl.
CPC .......... *H03M 1/0631* (2013.01); *G01N 9/002* (2013.01); *G01N 11/16* (2013.01); *G01N 2009/006* (2013.01); *G08C 19/16* (2013.01)

(58) Field of Classification Search
CPC ..... H03M 1/0631; G01N 9/002; G01N 11/16; G01N 2009/006; G01D 3/022; G01F 23/296; G08C 19/16
See application file for complete search history.

(56) References Cited

U.S. PATENT DOCUMENTS 5,671,154 A   9/1997   Iizuka et al.
6,202,928 B1  3/2001   Boersma
(Continued)

FOREIGN PATENT DOCUMENTS

WO   2011005454 A2   1/2011
WO   2014175902 A1   10/2014
(Continued)

*Primary Examiner* — Eric S. McCall
*Assistant Examiner* — Timothy P Graves
(74) *Attorney, Agent, or Firm* — The Ollila Law Group LLC

(57) ABSTRACT

A system and method of generating a synthetic time period output signal for a fork density sensor (601) which produces a consistent and low-noise output signal (705) which is identical in frequency to the frequency at which the fork density meter vibrates. Such a synthetic signal generated by a meter signal prevents any real noise from the pickoffs from propagating to the output meter and removes process noise and interference from the produced output signal.

15 Claims, 7 Drawing Sheets

(51) Int. Cl.
*G01N 9/00* (2006.01)
*G08C 19/16* (2006.01)

(56) References Cited

U.S. PATENT DOCUMENTS

| | | | |
|---|---|---|---|
| 2005/0140522 A1* | 6/2005 | Heilig | G01D 3/022 340/870.01 |
| 2006/0031030 A1* | 2/2006 | Bennett | G01F 23/2967 702/50 |
| 2009/0205411 A1 | 8/2009 | Muller | |
| 2010/0161251 A1 | 6/2010 | D'Angelico et al. | |
| 2014/0245834 A1* | 9/2014 | Urban | G01F 23/2965 73/584 |
| 2015/0128682 A1* | 5/2015 | Downie | G01N 9/002 73/24.01 |

FOREIGN PATENT DOCUMENTS

| | | |
|---|---|---|
| WO | 2014176122 A1 | 10/2014 |
| WO | WO2014/176122 * | 10/2014 |

* cited by examiner

METHOD FOR GENERATING A SYNTHETIC TIME PERIOD OUTPUT SIGNAL

TECHNICAL FIELD

The embodiments described below relate to vibratory sensors and, more particularly, to generating a synthetic time period output signal to compensate for errors caused by process noise that can occur in current density measurements.

BACKGROUND OF THE INVENTION

Vibratory sensors, such as vibratory densitometers and vibratory viscometers, operate by detecting motion of a vibrating element that vibrates in the presence of a fluid to be characterized. The vibratory element has a vibration response that may have a vibration response parameter such as a resonant frequency or quality factor Q. The vibration response of the vibrating element is generally affected by the combined mass, stiffness, and damping characteristics of the vibrating element in combination with the fluid. Properties associated with the fluid, such as density, viscosity, temperature and the like, can be determined by processing a vibration signal or signals received from one or more motion transducers associated with the vibrating element. The processing of the vibration signal may include determining the vibration response parameter.

FIG. 1 shows a prior art vibratory sensor comprising a vibratory element and meter electronics coupled to the vibratory element. The prior art vibratory sensor includes a driver for vibrating the vibratory element and a pickoff that creates a vibration signal in response to the vibration. The vibration signal is typically a continuous time or analog signal. The meter electronics receives the vibration signal and processes the vibration signal to generate one or more fluid characteristics or fluid measurements. The meter electronics determines both the frequency and the amplitude of the vibration signal. The frequency and amplitude of the vibration signal can be further processed to determine a density of the fluid.

The prior art vibratory sensor provides a drive signal for the driver using a closed-loop circuit. The drive signal is typically based on the received vibration signal. The prior art closed-loop circuit modifies or incorporates the vibration signal or parameters of the vibration signal into the drive signal. For example, the drive signal may be an amplified, modulated, or an otherwise modified version of the received vibration signal. The received vibration signal can therefore comprise a feedback that enables the closed-loop circuit to achieve a target frequency. Using the feedback, the closed-loop circuit incrementally changes the drive frequency and monitors the vibration signal until the target frequency is reached.

Fluid properties, such as the viscosity and density of the fluid, can be determined from the frequencies where the phase difference between the drive signal and the vibration signal is 135° and 45°. These desired phase differences, denoted as first off-resonant phase difference $\phi 1$ and second off-resonant phase difference $\phi 2$, can correspond to the half power or 3 dB frequencies. The first off-resonant frequency $\omega 1$ is defined as a frequency where the first off-resonant phase difference $\phi 1$ is 135°. The second off-resonant frequency $\omega 2$ is defined as a frequency where the second off-resonant phase difference $\phi 2$ is 45°. Density measurements made at the second off-resonant frequency $\omega 2$ can be independent of fluid viscosity. Accordingly, density measurements made where the second off-resonant phase difference $\phi 2$ is 45° can be more accurate than density measurements made at other phase differences.

The first and second off-resonant phase differences $\phi 1$, $\phi 2$ are typically not known prior to measurement. Accordingly, the closed-loop circuit must incrementally approach the first and second off-resonant phase differences $\phi 1$, $\phi 2$ using the feedback as described in the foregoing. The incremental approach associated with the closed-loop circuit can cause a delay in determining the vibration response parameter and, therefore, cause a delay in determining the viscosity, density, or other properties of the fluid. The delays in determining such measurements can be prohibitively expensive in many applications of the vibratory sensor.

Accordingly, there is a need for controlling a vibration of a vibratory sensor based on a phase error. There is also a need for reaching the first and second off-resonant phase difference $\phi 1$, $\phi 2$ without the delays associated with the closed-loop circuit.

SUMMARY OF THE INVENTION

The present application is designed to improve accuracy of vibratory flow meters by compensating for the error caused by process noise.

A method of controlling a vibration of a vibratory element based on a phase error is provided. According to an embodiment, the method comprises: vibrating the vibratory element with a drive signal, receiving a vibration signal from the vibratory element, filtering the signal, inputting the synthesized filtered signal into an output circuit; generating a TPSig output signal and measuring a phase difference between the drive signal and the vibration signal. The method also comprises determining a phase error between a target phase difference and the measured phase difference and calculating one or more vibration control terms with the determined phase error.

A method of using meter electronics for controlling a vibration of a vibratory element is provided. According to an embodiment, the meter electronics used to control a vibration of a vibratory element comprises: a driver circuit coupled to the vibratory element, the driver circuit configured to provide a drive signal to a vibratory element. The meter electronics also comprises a receiver circuit coupled to the vibratory element, the receiver circuit configured to receive a vibration signal from the vibratory element. The meter electronics is configured to measure a phase difference between the drive signal and the vibration signal, determine a phase error between a target phase difference and the measured phase difference, and calculate one or more vibration control terms with the determined phase error.

Aspects of the Invention

In one aspect of the invention, a method of generating a signal to compensate for errors caused by process noise in density measurements, comprises:

receive a signal from a meter; filter the signal; synthesize the filtered signal; input the synthesized filtered signal into an output circuit; and generate a TPSig output signal.

Preferably, the meter is a fork density sensor.

Preferably, the filtering also includes gaining up the signal.

Preferably, the filtering uses an analog circuit.

Preferably, the output circuit is a TPSig circuit.

Preferably, the TPSig circuit provides a square wave signal.

Preferably, the square wave signal is entirely synthesized.

Preferably, the signal from the sensor is an analog pickoff signal.

In another aspect of the invention, a method of generating a synthetic time period output signal, comprises:

receive a pickoff signal from a fork density sensor meter; filter the pickoff signal; synthesize the filtered analog pickoff signal to create a drive signal; and input the drive signal to generate a TPSig output signal.

Preferably, the filtering also includes gaining up the signal.

Preferably, the filtering uses an analog circuit.

Preferably, the output circuit is a TPSig circuit.

Preferably, the TPSig circuit provides a square wave signal.

Preferably, the square wave signal is entirely synthesized.

Preferably, the signal from the sensor is an analog pickoff signal.

BRIEF DESCRIPTION OF THE DRAWINGS

The same reference number represents the same element on all drawings. It should be understood that the drawings are not necessarily to scale.

DETAILED DESCRIPTION OF THE INVENTION

FIGS. 1-7 and the following description depict specific examples to teach those skilled in the art how to make and use the best mode of embodiments for controlling a vibration of a vibratory sensor based on a phase error. For the purpose of teaching inventive principles, some conventional aspects have been simplified or omitted. Those skilled in the art will appreciate variations from these examples that fall within the scope of the present description. Those skilled in the art will appreciate that the features described below can be combined in various ways to form multiple variations of controlling a vibration of a vibratory sensor based on a phase error. As a result, the embodiments described below are not limited to the specific examples described below, but only by the claims and their equivalents.

Figure 1:
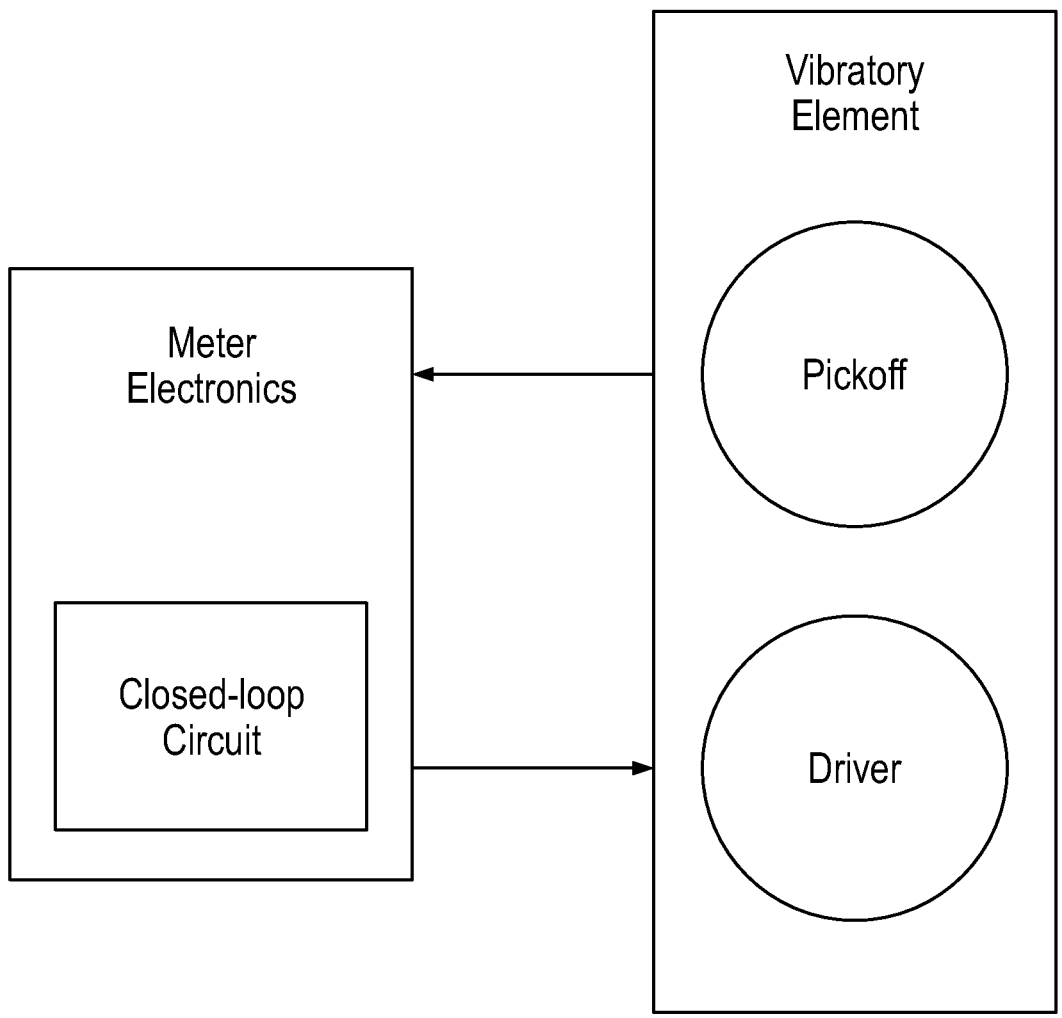
FIG. 1 shows a prior art vibratory sensor comprising a vibratory element and meter electronics coupled to the vibratory element.
Figure 2:
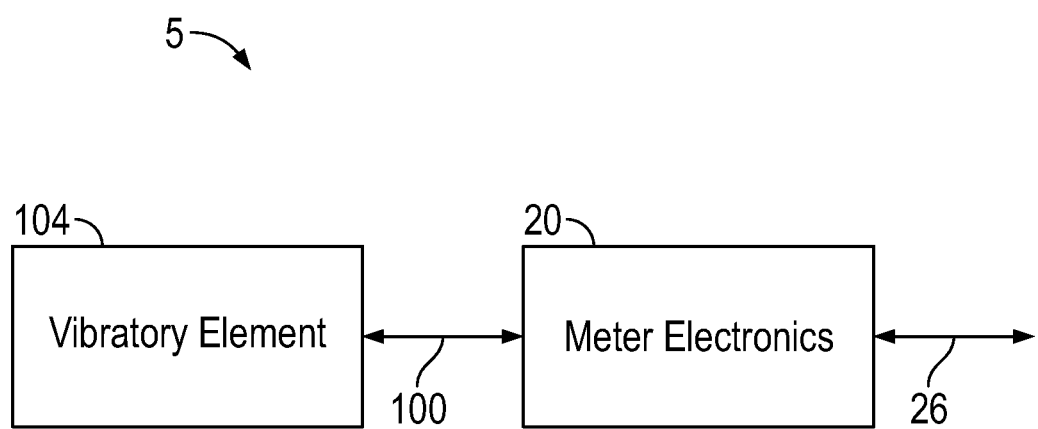
FIG. 2 shows a vibratory sensor according to an embodiment.

FIG. 2 shows a vibratory sensor 5 according to an embodiment. The vibratory sensor 5 may comprise a vibratory element 104 and meter electronics 20, wherein the vibratory element 104 is coupled to the meter electronics 20 by a lead or leads 100. In some embodiments, the vibratory sensor 5 may comprise a vibratory tine sensor or fork density sensor (see FIG. 3 and the accompanying discussion). However, other vibratory sensors are contemplated and are within the scope of the description and claims.

The vibratory sensor 5 may be at least partially immersed into a fluid to be characterized. The fluid can comprise a liquid or a gas. Alternatively, the fluid can comprise a multi-phase fluid, such as a liquid that includes entrained gas, entrained solids, multiple liquids, or combinations thereof. Some exemplary fluids include cement slurries, petroleum products, or the like. The vibratory sensor 5 may be mounted in a pipe or conduit, a tank, a container, or other fluid vessels. The vibratory sensor 5 can also be mounted in a manifold or similar structure for directing a fluid flow. However, other mounting arrangements are contemplated and are within the scope of the description and claims.

The vibratory sensor 5 operates to provide fluid measurements. The vibratory sensor 5 may provide fluid measurements including one or more of a fluid density and a fluid viscosity for a fluid, including flowing or non-flowing fluids. The vibratory sensor 5 may provide fluid measurements including a fluid mass flow rate, a fluid volume flow rate, and/or a fluid temperature. This listing is not exhaustive and the vibratory sensor 5 may measure or determine other fluid characteristics.

The meter electronics 20 can provide electrical power to the vibratory element 104 via the lead or leads 100. The meter electronics 20 controls operation of the vibratory element 104 via the lead or leads 100. For example, the meter electronics 20 may generate a drive signal and provide the generated drive signal to the vibratory element 104, wherein the vibratory element 104 generates a vibration in one or more vibratory components using the generated drive signal. The generated drive signal can control the vibrational amplitude and frequency of the vibratory element 104. The generated drive signal can also control the vibrational duration and/or vibrational timing.

The meter electronics 20 can also receive a vibration signal or signals from the vibratory element 104 via the lead or leads 100. The meter electronics 20 may process the vibration signal or signals to generate a density measurement, for example. The meter electronics 20 processes the vibration signal or signals received from the vibratory element 104 to determine a frequency of the signal or signals. Further, or in addition, the meter electronics 20 processes the vibration signal or signals to determine other characteristics of the fluid, such as a viscosity or a phase difference between signals, that can be processed to determine a fluid flow rate, for example. As can be appreciated, the phase difference is typically measured or expressed in spatial units such as degrees or radians although any suitable unit can be employed such as time-based units. If time-based units are employed, then the phase difference may be referred to by those in the art as a time-delay between the vibration signal and the drive signal. Other vibrational response characteristics and/or fluid measurements are contemplated and are within the scope of the description and claims.

The meter electronics 20 can be further coupled to a communication link 26. The meter electronics 20 may communicate the vibration signal over the communication link 26. The meter electronics 20 may also process the received vibration signal to generate a measurement value or values and may communicate the measurement value or values over the communication link 26. In addition, the meter electronics 20 can receive information over the communication link 26. For example, the meter electronics 20 may receive commands, updates, operational values or operational value changes, and/or programming updates or changes over the communication link 26.

Figure 3:
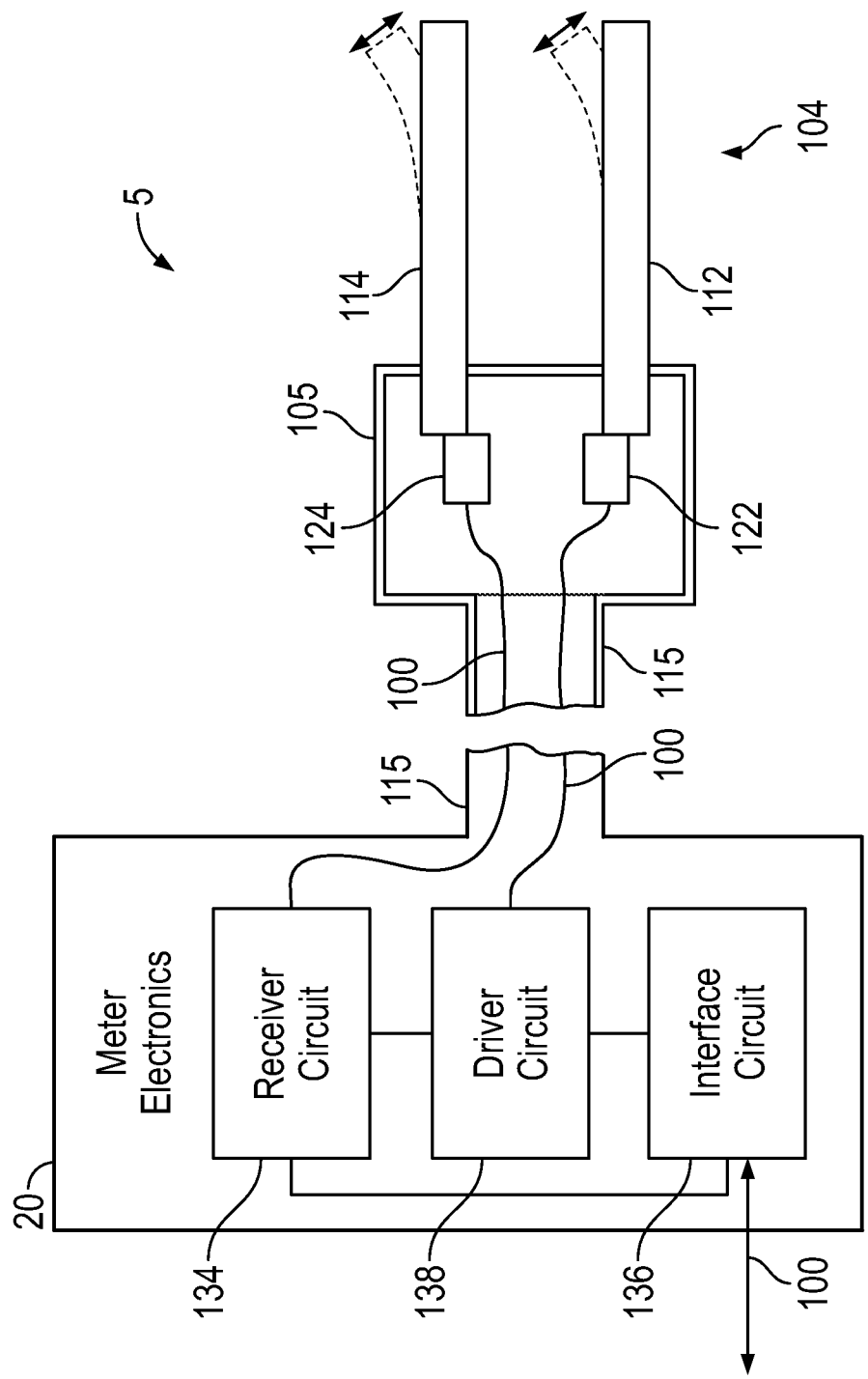
FIG. 3 shows the vibratory sensor according to an embodiment.

FIG. 3 shows the vibratory sensor 5 according to an embodiment. The meter electronics 20 is coupled to the vibratory element 104 by a shaft 115 in the embodiment shown. The shaft 115 may be of any desired length. The shaft 115 may be at least partially hollow. Wires or other conductors may extend between the meter electronics 20 and the vibratory element 104 through the shaft 115. The meter electronics 20 includes circuit components such as a receiver circuit 134, an interface circuit 136, and a driver circuit 138. In the embodiment shown, the receiver circuit 134 and the driver circuit 138 are directly coupled to the leads of the vibratory element 104. Alternatively, the meter electronics 20 can comprise a separate component or device from the vibratory element 104, wherein the receiver circuit 134 and the driver circuit 138 are coupled to the vibratory element 104 via the lead or leads 100.

In the embodiment shown, the vibratory element 104 of the vibratory sensor 5 comprises a tuning fork structure, wherein the vibratory element 104 is at least partially immersed in the fluid being measured. The vibratory element 104 includes a housing 105 that can be affixed to another structure, such as a pipe, conduit, tank, receptacle, manifold, or any other fluid-handling structure. The housing 105 retains the vibratory element 104 while the vibratory element 104 remains at least partially exposed. The vibratory element 104 is therefore configured to be immersed in the fluid.

The vibratory element 104 in the embodiment shown includes first and second tines 112 and 114 that are configured to extend at least partially into the fluid. The first and second tines 112 and 114 comprise elongated elements that may have any desired cross-sectional shape. The first and second tines 112 and 114 may be at least partially flexible or resilient in nature. The vibratory sensor 5 further includes corresponding first and second piezo elements 122 and 124 that comprise piezo-electric crystal elements. The first and second piezo elements 122 and 124 are located adjacent to the first and second tines 112 and 114, respectively. The first and second piezo elements 122 and 124 are configured to contact and mechanically interact with the first and second tines 112 and 114.

The first piezo element 122 is in contact with at least a portion of the first tine 112. The first piezo element 122 is also electrically coupled to the driver circuit 138. The driver circuit 138 provides the generated drive signal to the first piezo element 122. The first piezo element 122 expands and contracts when subjected to the generated drive signal. As a result, the first piezo element 122 may alternatingly deform and displace the first tine 112 from side to side in a vibratory motion (see dashed lines), disturbing the fluid in a periodic, reciprocating manner.

The second piezo element 124 is shown as coupled to a receiver circuit 134 that produces the vibration signal corresponding to the deformations of the second tine 114 in the fluid. Movement of the second tine 114 causes a corresponding electrical vibration signal to be generated by the second piezo element 124. The second piezo element 124 transmits the vibration signal to the meter electronics 20. The meter electronics 20 includes the interface circuit 136.

The interface circuit 136 can be configured to communicate with external devices. The interface circuit 136 communicates a vibration measurement signal or signals and may communicate determined fluid characteristics to one or more external devices. The meter electronics 20 can transmit vibration signal characteristics via the interface circuit 136, such as a vibration signal frequency and a vibration signal amplitude of the vibration signal. The meter electronics 20 may transmit fluid measurements via the interface circuit 136, such as a density and/or viscosity of the fluid, among other things. Other fluid measurements are contemplated and are within the scope of the description and claims. In addition, the interface circuit 136 may receive communications from external devices, including commands and data for generating measurement values, for example. In some embodiments, the receiver circuit 134 is coupled to the driver circuit 138, with the receiver circuit 134 providing the vibration signal to the driver circuit 138.

The driver circuit 138 generates the drive signal for the vibratory element 104. The driver circuit 138 can modify characteristics of the generated drive signal. The driver circuit 138 includes an open-loop drive. The open-loop drive may be used by the driver circuit 138 to generate the drive signal and supply the generated drive signal to the vibratory element 104 (e.g., to the first piezo element 122). In some embodiments, the open-loop drive generates the drive signal to achieve a target phase difference $\phi_t$, commencing at an initial frequency $\phi_i$. The open-loop drive may not operate based on feedback from the vibration signal, as will be described in more detail in the following with reference to FIG. 4.

Figure 4:
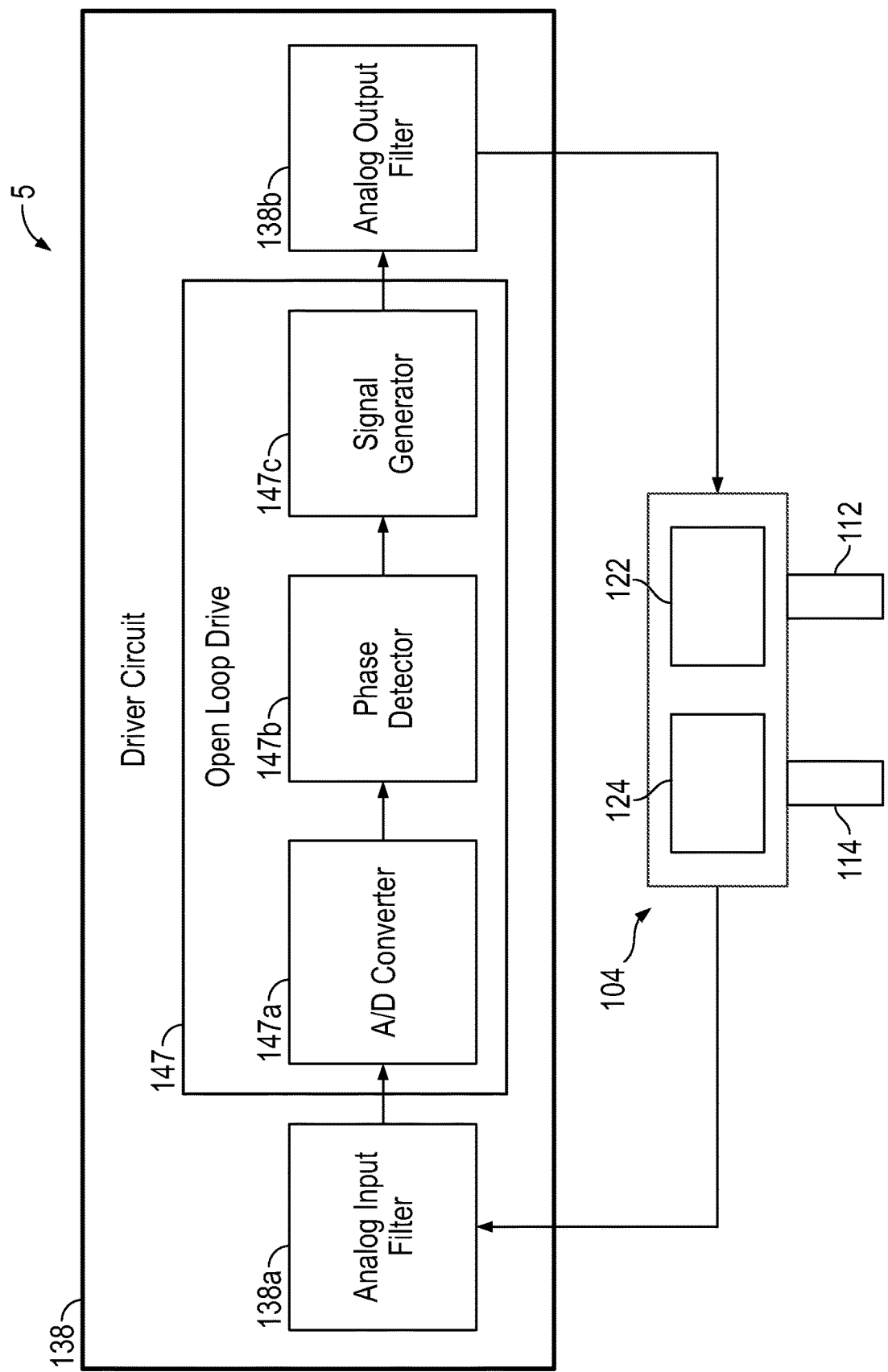
FIG. 4 shows a block diagram of the vibratory sensor with a more detailed representation of the driver circuit.

FIG. 4 shows a block diagram of the vibratory sensor 5 with a more detailed representation of the driver circuit 138. The vibratory sensor 5 is shown with the driver circuit 138. The receiver circuit 134 and the interface circuit 136 are not shown for clarity. The driver circuit 138 includes an analog input filter 138a and an analog output filter 138b that are coupled to the open-loop drive 147. The analog input filter 138a filters the vibration signal and the analog output filter 138b filters the generated drive signal.

The open-loop drive 147 includes an analog to digital converter 147a that is coupled to a phase detector 147b. The phase detector 147b is coupled to a signal generator 147c. Also shown is the vibratory element 104, which includes the first piezo element 122 and the second piezo element 124. The open-loop drive 147 can be implemented with a digital signal processor that is configured to execute one or more codes or programs that sample, process, and generate signals. Additionally or alternatively, the open-loop drive 147 can be implemented with an electronics circuit coupled to the digital signal processor, or the like.

The vibration signal provided by the first piezo element 122 is sent to the analog input filter 138a. The analog input filter 138a filters the vibration signal prior to the vibration signal being sampled by the analog to digital converter 147a. In the embodiment shown, the analog input filter 138a can be comprised of a low pass filter with cutoff frequency that is about half the sample rate of the open-loop drive 147 although any suitable low pass filter can be employed. The low pass filter can be provided by passive components such as an inductor, a capacitor, and a resistor, although any suitable components, distributed or discrete, such as an operational amplifier filter, can be employed.

The analog to digital converter 147a can sample the filtered vibration signal to form a sampled vibration signal. The analog to digital converter 147a can also sample the generated drive signal through a second channel (not shown). The sampling can be by any appropriate sampling method. As can be appreciated, the generated drive signal sampled by the analog to digital converter 147a does not have noise associated with the vibration signal. The generated drive signal is provided to the phase detector 147b.

The phase detector 147b can compare the phases of the sampled vibration and generated drive signals. The phase detector 147b can be a processor configured to execute one or more codes or programs that sample, process, and generate signals to detect a phase difference between two signals, as will be described in more detail in the following with reference to FIG. 5. Still referring to the embodiment of FIG. 4, the comparison provides a measured phase difference $\phi_m$ between the sampled vibration signal and the sampled generated drive signal.

The measured phase difference $\phi_m$ is compared with the target phase difference $\phi_t$. The target phase difference $\phi_t$ is a desired phase difference between the vibration signal and the generated drive signal. For example, in an embodiment where the target phase difference $\phi_t$ is approximately 45°, the difference between the measured phase difference $\phi_m$ and the target phase difference $\phi_t$ can be zero if the measured phase difference $\phi_m$ is also the same as or about 45°. However, any appropriate target phase difference $\phi_t$ can be employed in alternative embodiments. Using the comparison between the measured phase difference $\phi_m$ and the target phase difference $\phi_t$, the phase detector 147b can generate a command frequency $\omega_c$.

The command frequency $\omega_c$ can be employed to generate the drive signal. Additionally or alternatively, an initial frequency $\omega_i$ that is not determined from the comparison between the measured phase difference $\phi_m$ and the target phase difference $\phi_t$ can be employed. The initial frequency $\omega_i$ could be a preselected frequency used to form an initial generated drive signal. The initial generated drive signal can be sampled as described in the foregoing and compared with the sampled vibration signal. The comparison between the sampled initial generated drive signal and the sampled vibration signal can be used to generate the command frequency $\omega_c$. The command frequency $\omega_c$ and the initial frequency $\omega_i$ can have units of radians per second although any suitable units, such as, for example, Hertz (Hz), can be employed. The command frequency $\omega_c$ or the initial frequency $\omega_i$ can be provided to the signal generator 147c.

The signal generator 147c can receive the command frequency $\omega_c$ from the phase detector 147b and provide the generated drive signal with a frequency that is the same as the command frequency $\omega_c$. The generated drive signal may be sent, as discussed in the foregoing, to the analog to digital converter 147a. The generated drive signal is also sent to the first piezo element 122 via the analog output filter 138b. Additionally or alternatively, the generated drive signal can be sent to other components in other embodiments.

As discussed in the foregoing, the vibratory element 104 has a vibration response due to the drive signal. The vibration response has vibration response parameters, such as a resonant frequency $\omega 0$, quality factor Q, or the like, which can be employed to calculate various properties of the fluid being measured. The vibration response and exemplary vibration response parameters, as well as how the vibration response parameters can be used to calculate the properties of the fluid, are discussed in more detail in the following.

Figure 5:
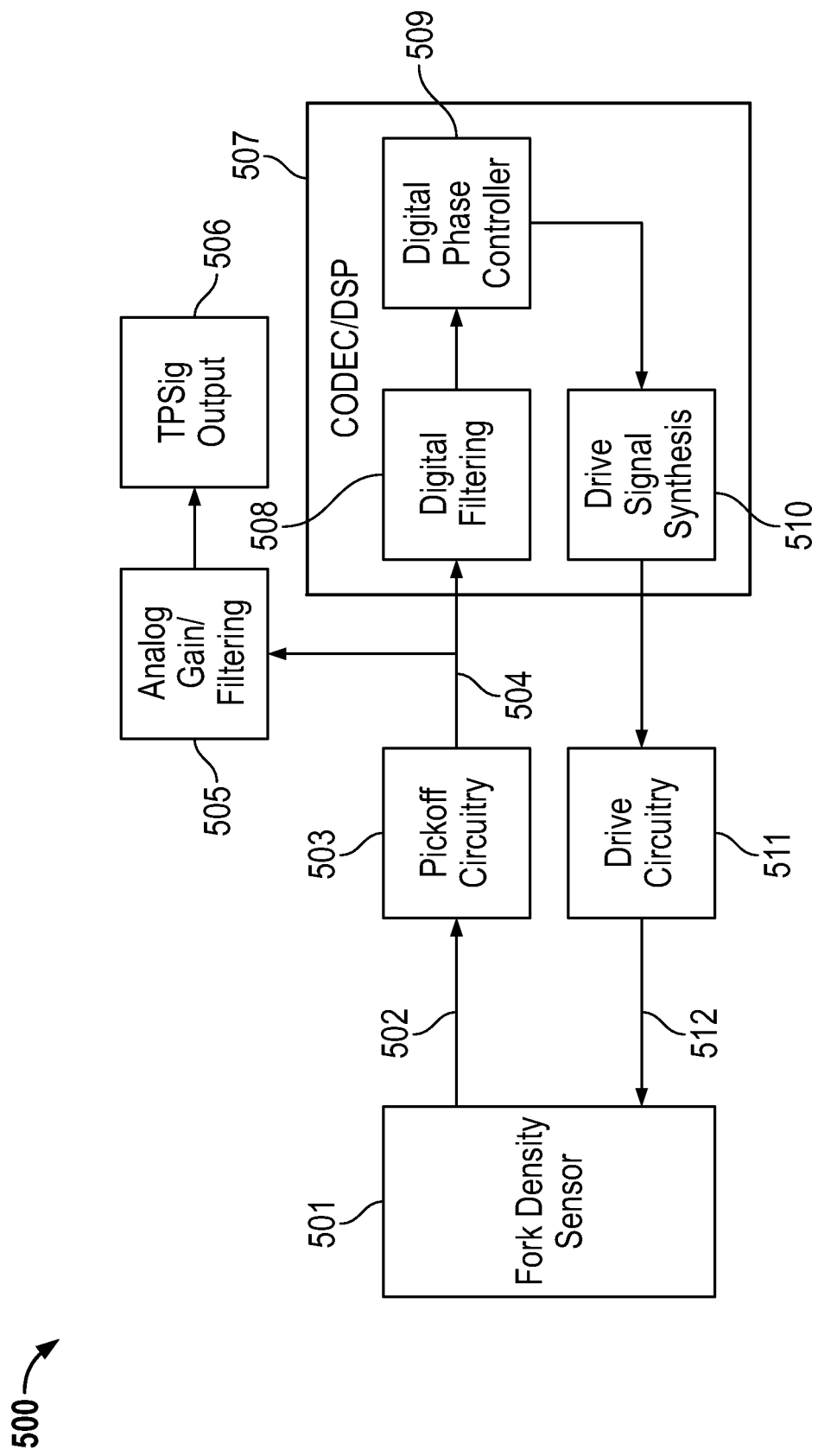
FIG. 5 depicts a block diagram of the relation between a fork pickoff, a TPSig, and drive generation circuitry.

FIG. 5 illustrates a block diagram 500 of a current fork density product. The fork density sensor 501 is a collection of at least one sensor located on a fork meter. The fork meter may be used to determine the density of a fluid by comparing the resonant frequency of the fork when no fluid is present with the frequency of the fork when immersed in the fluid to be measured. The fork meter is part of a feedback loop and is connected by a first contact 502 to a pickoff circuitry 503. The pickoff circuitry 503 branches 504 to an analog gain/filtering 505 and to a synthetic time period output signal 506, hereinafter referred to as TPSig. The pickoff circuitry 503 is also connected to an analog to digital converter which is connected to a digital signal processor 507, hereinafter referred to as a CODEC/DSP 507, which is comprised of a digital filtering device 508, a digital phase controller 509 and a drive signal synthesis 510. The CODEC/DSP 507 analyzes the signal from the fork meter, digitally filters the signal 507, adjusts the phase of the signal 509 and generates a synthesized drive signal. The synthesized drive signal is sent to the drive circuitry 511 that provides a driving force which may also be referred to as the drive signal.

The time period output may be created by processing the signal from the fork density sensor 501. This current method of filtering and gaining a signal originating from the pickoffs using analog means works well in many situations where a fork density meter is used. However problems may occur in situations where large amounts of process noise are present.

Process noise may be caused by any number of not modeled system dynamics of disturbance inputs. Process noise may emanate from internal sources and may include, but is not limited to, parameter noise, thermal noise, input noise, thermal EMF, dielectric absorption, audio phonic noise and the like. Process noise may also emanate from external noise sources and may include, but is not limited to, electric field coupling, inductive coupling, radio frequency coupling, ground loops, common mode rejection noise, cable noise, noise filtering and the like.

High levels of process noise may grow to become a significant and consistent component within the pickoff signal. Such process noise situations may cause the TPSig output to become jittery to the degree that the input signal can no longer successfully be measured by a flow computer.

Process noise occurring on the pickoffs is a great concern within the fork phase error control. The fork density meter technology disclosed in application 62/094,217 enables the fork density meter to successfully drive the fork and digitally measure density in process noise conditions where such fork density meters have previously failed to operate. The 62/094,217 application technology does not address the actual noise in the pickoffs. This noise is fed into the TPSig circuit and causes flow computers to lose their time period measurement.

For TPSig output to be consistently measured by a flow computer in high noise applications, the noise from the analog signal must be removed before the signal is fed into the TPSig output circuit. Synthesizing the signal used for the TPSig output ensures any real process noise on the real pickoff signal is not capable of propagating to the flow computer measurement.

The time period output may also be created by tying into the drive signal.

Figure 6:
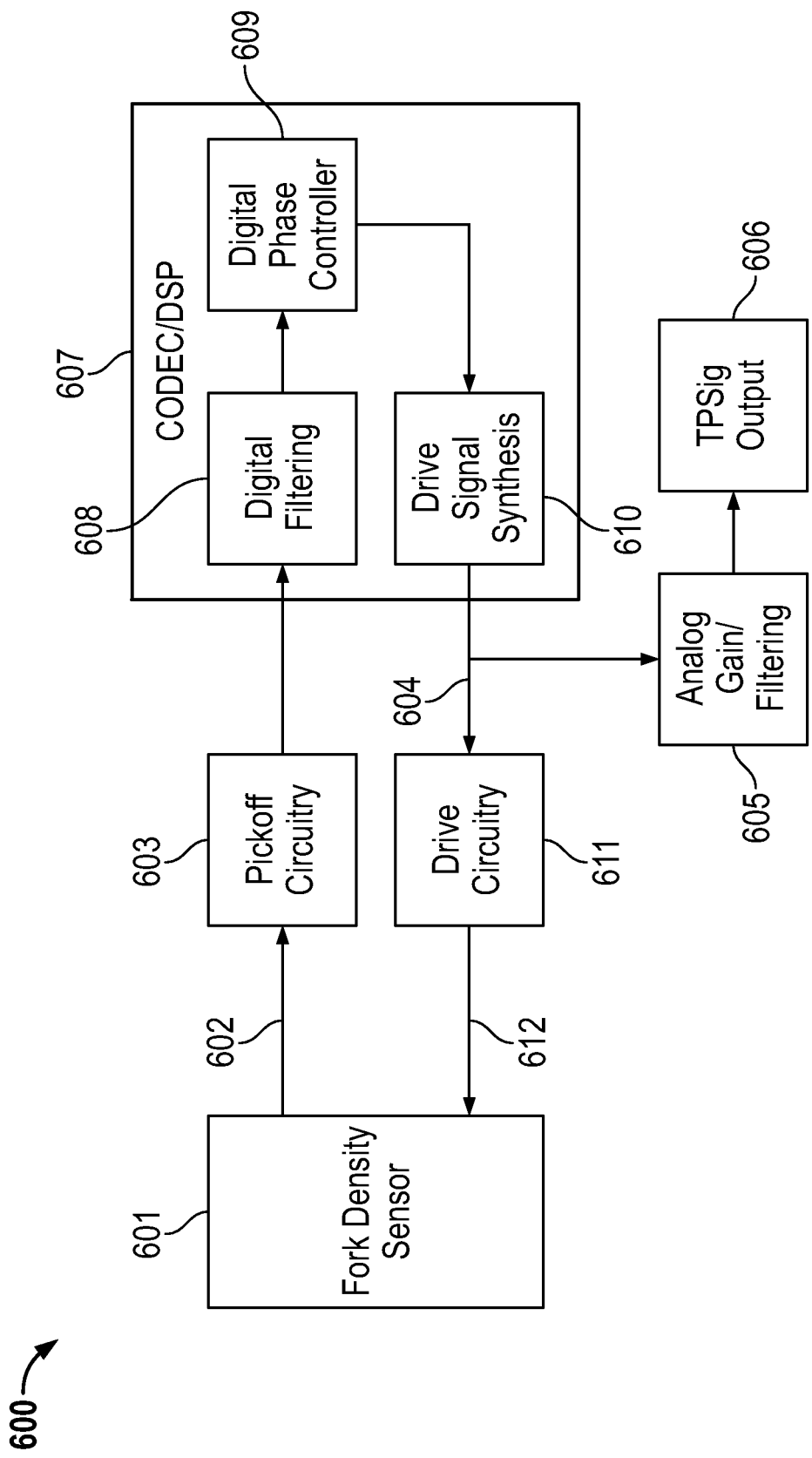
FIG. 6 depicts a block diagram of the improvement to the relation between a fork pickoff, a TPSig, and drive generation circuitry.

FIG. 6 illustrates the improvement embodiment as a block diagram 600. The fork density sensor 601 is connected by a first contact 602 to a pickoff circuitry 603. The pickoff circuitry 603 is also connected to a CODEC/DSP 607, which is comprised of a digital filtering device 608, a digital phase controller 609 and to a drive signal synthesis 610. The CODEC/DSP 607 is further connected to a drive circuitry 611 and a second contact 612 is connected to the fork density sensor 601.

The distinction between the present embodiment and the improvement is that in the first embodiment 500 the branch 504 occurs between the pickoff circuitry 503 and the CODEC/DSP 507 while in the second embodiment 600 the branch occurs between the CODEC/DSP 607 and the drive circuitry 611.

Figure 7:
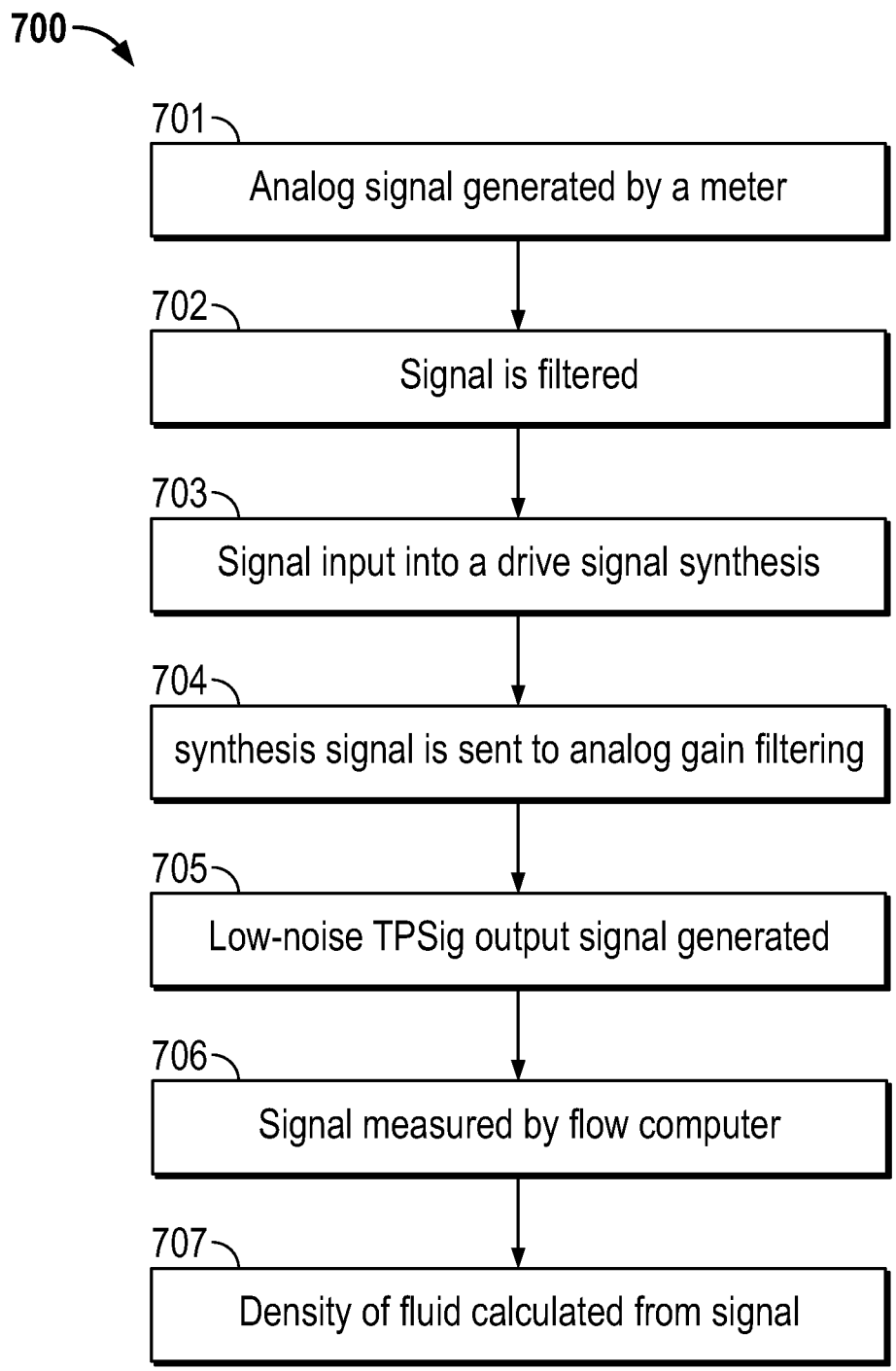
FIG. 7 depicts a flow chart of the steps within the method of generating a time period signal.

FIG. 7 illustrates the fork density option to have a user receive raw sensor time period through the TPSig output meter. Time period signal generation begins with an analog pickoff signal 701 originating from the fork density sensor meter 601. The signal comes from the fork density sensor meter 601 and goes into a filter where it is filtered 702. The signal is then sent to the drive signal synthesis 703. TPSig is then sent to an analog gain/filtering where it may be gained up 704. Gained up herein refers to the ability of a circuit to increase the power or the amplitude of a signal by adding energy from a power supply to a signal. The TPSig output circuit outputs and provides a square wave signal representing the oscillation frequency of the meter 705. This signal is then measured 706 by a flow computer, which uses this signal's time period in conjunction with other process parameters to calculate the density 707 of the fluid in which the prongs of the fork, hereinafter referred to as fork tines, are inserted.

To review, the process steps are as follows:
1. Obtain the signal from the sensor on the meter 601
2. Run the signal through the CODEC/DSP 607
3. Generate the synthesized drive signal 610
4. Take the synthesized drive signal and send it to the analog gain/filter 605
5. Output the TPSig signal 606

A mode of implementation of the present application is through use of a drive signal synthesizer. The synthesizer generates the input signal for use as the input by the analog gain/filtering circuitry associated with the fork density transmitter. In the 62/094,217 application, the fork synthesized drive signal is the signal which controls the oscillation frequency of the fork density meter. In the present application, the drive signal can be used as the input signal to the analog gain/filter circuit to generate a consistent, low-noise TPSig output signal that oscillates at a frequency identical to the oscillation frequency of the fork density meter. A key advantage of the present application is that the signal is entirely digitally synthesized by the phase controller. This ensures that any real process noise which may appear in the pickoffs of the fork density meter is not capable of propagating to the TPSig output.

The detailed descriptions of the above embodiments are not exhaustive descriptions of all embodiments contemplated by the inventors to be within the scope of the Application. Indeed, persons skilled in the art will recognize that certain elements of the above-described embodiments may variously be combined or eliminated to create further embodiments, and such further embodiments fall within the scope and teachings of the Application. It will also be apparent to those of ordinary skill in the art that the above-described embodiments may be combined in whole or in part to create additional embodiments within the scope and teachings of the Application.

The invention claimed is:

1. A method of generating a time period output signal, the method comprising:
receiving a signal from a meter (601);
filtering (608) the signal;
synthesizing (610) an analog synthesized filtered signal based on the filtered signal; and
inputting the analog synthesized filtered signal (604) into a drive circuitry (611) and an output circuit;
generating, with the output circuit, the time period output signal (606) from the analog synthesized filtered signal (604).

2. The method of claim 1, wherein the meter is a fork density sensor (601).

3. The method of claim 1, wherein the filtering also includes gaining up (605) the signal.

4. The method of claim 3 wherein the filtering uses an analog circuit (605).

5. The method of claim 1, wherein the output circuit is a TPSig output circuit (606) that is configured to generate the time period output signal and transmit the time period output signal to a computer.

6. The method of claim 5, wherein the TPSig output circuit (606) provides a square wave signal.

7. The method of claim 6, wherein the square wave signal is entirely synthesized.

8. The method of claim 1, wherein the signal from the sensor is an analog pickoff (603) signal.

9. A method of generating a synthetic time period output signal, comprising:
receiving a pickoff signal from a fork density sensor meter (701);
filtering the pickoff signal (702);
synthesizing the filtered analog pickoff signal (704) to create an analog drive signal; and
inputting the analog drive signal into a drive circuitry to generate a drive signal and into an output circuit to generate a time period output signal.

10. The method of claim 9, wherein the filtering also includes gaining up (704) the signal.

11. The method of claim 9 wherein the filtering (702) uses an analog circuit.

12. The method of claim 9, wherein the output circuit is a TPSig output circuit that is configured to generate the time period output signal and transmit the time period output signal to a computing device.

13. The method of claim 12, wherein the TPSig output circuit provides a square wave signal.

14. The method of claim 13, wherein the square wave signal is entirely synthesized.

15. The method of claim 9, wherein the signal from the sensor is an analog pickoff signal.

* * * * *